(12) United States Patent
Fike

(10) Patent No.: US 6,864,814 B1
(45) Date of Patent: Mar. 8, 2005

(54) SYSTEM AND METHOD FOR IMPROVING DYNAMIC RANGE OF ANALOG-TO DIGITAL CONVERTERS

(75) Inventor: John M Fike, Austin, TX (US)

(73) Assignee: Qlogic Corporation, Aliso Viejo, CA (US)

( * ) Notice: Subject to any disclaimer, the term of this patent is extended or adjusted under 35 U.S.C. 154(b) by 39 days.

(21) Appl. No.: 10/600,779

(22) Filed: Jun. 20, 2003

Related U.S. Application Data
(60) Provisional application No. 60/392,238, filed on Jun. 27, 2002.

(51) Int. Cl.[7] ............................ H03M 1/10; G05F 3/16; G05F 3/02
(52) U.S. Cl. ..................... 341/120; 323/313; 327/539
(58) Field of Search ................ 341/155, 118, 341/120, 172, 141; 327/539, 544, 93, 540; 323/313, 316

(56) References Cited

U.S. PATENT DOCUMENTS

| | | | | |
|---|---|---|---|---|
| 5,281,866 A | * | 1/1994 | Rundel | 327/544 |
| 5,668,551 A | * | 9/1997 | Garavan et al. | 341/120 |
| 5,736,949 A | * | 4/1998 | Ong et al. | 341/141 |
| 6,133,719 A | * | 10/2000 | Maulik | 323/313 |
| 6,445,315 B1 | * | 9/2002 | den Breejen | 341/118 |
| 6,445,330 B1 | * | 9/2002 | Thomsen et al. | 341/172 |
| 6,462,612 B1 | * | 10/2002 | Roh et al. | 327/539 |
| 6,535,054 B1 | * | 3/2003 | Ceekala et al. | 327/539 |
| 6,724,176 B1 | * | 4/2004 | Wong et al. | 323/316 |

* cited by examiner

*Primary Examiner*—Patrick Wamsley
(74) *Attorney, Agent, or Firm*—Tejinder Singh, Klein, O'Neill & Singh, LLP

(57) ABSTRACT

An analog to digital converter ("ADC") is provided that can be used in a system with an internal or external CPU or in an ASIC. The ADC includes a band gap reference (BGR) circuit whose output is internally coupled to an analog input of the ADC; and a positive analog supply voltage (AVDD) and a positive analog reference voltage (REFP) operationally coupled to a same voltage supply; wherein a BGR value is used by a CPU as a calibration constant for determining an AVDD value, a REFP value, and a Bit Weight value.

9 Claims, 4 Drawing Sheets

SYSTEM AND METHOD FOR IMPROVING DYNAMIC RANGE OF ANALOG-TO-DIGITAL CONVERTERS

CROSS REFERENCE TO RELATED APPLICATIONS

The disclosure in this application claims priority to the provisional patent application filed on Jun. 27, 2002, Ser. No. 60/392,238, entitled "System For Improving The Dynamic Range of Analog-To-Digital Converters" incorporated herein by reference in its entirety.

BACKGROUND OF THE INVENTION

1. Field of the Invention

The present invention relates to processors, and more particularly to improving the dynamic range of analog to digital converters ("ADC").

2. Background

Advances in digital integrated circuit technology demand lower power supply voltages for increased performance and reduced power. Hence, the dynamic range available for the analog portions of mixed-signal integrated circuits (i.e., integrated circuits with both digital and analog circuits) has decreased accordingly. In general, the analog supply voltage cannot exceed the digital supply voltage in mixed-signal devices.

Typically, a central processing unit in a system using integrated circuits is available for calibrating voltages in common ADC applications. A prior art system illustrating the problem with conventional systems is shown in FIG. 1. Analog input signal(s) 102 (from Channel 1 through Channel N) enter ADC 101. A digital output 110 is sent to a central processing unit (CPU) 110 or any other component. A reference voltage 106B is applied to REFP 106, while REFN 108 is connected to analog ground.

Reference voltage 106B is typically implemented using a band gap reference ("BGR") circuit 103 where a resistor or current source 104 (referred to herein as "Source 104"). The current provided by source 104 must remain within the operating range of BGR device 103.

To compensate for supply voltage variations, current sources are often preferred over resistors. Current source devices typically require about a one-volt differential between their power input (V+ connection 105) and their output to BGR 103.

To be measurable, analog input voltages must remain in a range defined by REFP-REFN and REFP 106 must have a value that is less than or equal to AVDD 107. Hence, the available dynamic range of ADC 101 is diminished by the voltage required to operate the current source (or resistor). In low voltage integrated circuit designs this loss can be significant. For instance, in a 2.5V power supply environment using a current source that requires 1V to operate represents a forty percent (40%) loss of dynamic range. Also, BGR device(s) 103 is commonly available only in 2.5V and 1.2V versions. In a 2.5V power supply environment, a 1.2V BGR device 103 would have to be used in order to provide the operating voltage for the current source or resistor giving a 52% loss of dynamic range.

Also, if AVDD is measured in a conventional implementation, it must be divided down to a value less than REFP 106, as shown in FIG. 2 (using resistors 111 and 112), before being applied to an analog input. This reduces the accuracy of the measurement.

Therefore, what is desired is a system that can efficiently increase the dynamic range of ADCs without increasing the power supply voltage.

SUMMARY OF THE INVENTION

In one aspect of the present invention, an analog to digital converter ("ADC") is provided that can be used in a system with an internal or external CPU or in an ASIC. The ADC includes a band gap reference (BGR) circuit whose output is internally coupled to an analog input of the ADC; and a positive analog supply voltage (AVDD) and a positive analog reference voltage (REFP) operationally coupled to a same voltage supply; wherein a BGR value is used by a CPU as a calibration constant for determining an AVDD value, a REFP value, and a Bit Weight value.

In one aspect of the present invention, the dynamic range available for analog voltage measurement is increased.

In another aspect of the present invention, a pin is saved in the chip using the foregoing aspect of the present invention because the BGR connection to the ADC analog input is internal to the ASIC.

The present invention also saves an ASIC pin that would be required for a dedicated REFP connection by connecting REFP to AVDD internally.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. In the drawings, the same components have the same reference numerals. The illustrated embodiment is intended to illustrate, but not to limit the invention. The drawings include the following Figures.

DETAILED DESCRIPTION OF THE PREFERRED EMBODIMENTS

Definitions:

The following definitions are provided as they are typically (but not exclusively) used in the integrated circuit environment, implementing the various adaptive aspects of the present invention:

"ADC" (also, A/D Converter)—Analog-to-Digital Converter;

"ASIC"—Application Specific Integrated Circuit;

"AVDD"—Analog VDD (Positive analog supply voltage);

"AVSS"—Analog VSS (Negative analog supply voltage; connected to analog ground in single-supply analog circuits);

"BGR"—Band Gap Reference, a tight tolerance voltage reference source;

"Bit Weight"—The analog voltage value represented by one digital Least Significant Bit (LSB) which is the smallest potentially measurable analog voltage;

"CPU"—Central Processing Unit;

"Dynamic Range"—The difference between the largest measurable voltage value and the smallest measurable voltage value;

"REFP"—Positive analog reference voltage; typically it has a value that is algebraically less than or equal to AVDD;

"REFN"—Negative analog reference voltage; typically it has a value that is algebraically greater than or equal to AVSS; and "REFP−REFN"—The difference provides the range available for analog voltage measurement.

Before describing the adaptive aspects of the present invention, the following describes how the analog input voltage is determined from an ADC output:

Analog Input Voltage=ADC Digital Output

Value*Bit Weight

Where:

Bit Weight=(REFP−REFN)/$2^n$

Where "n" is the resolution of the ADC (i.e., the number of converted digital output bits).

The following provides an example of determining input voltage using a REFP value (106) of 2.5 volts (nominal), a REFN value of 0 volts (ground; single supply implementation), and ADC 101 with a resolution of 10 bits.

Since REFP is nominally 2.5 volts, the nominal bit weight value is given by:

Bit Weight (nominal)=2.5V/1024=2.44 mV

For an ADC digital output value of 200 hexadecimal (512 decimal), the input voltage would be:

Input Voltage (decimal)=512*2.44 mV=1.25V

Figure 3:
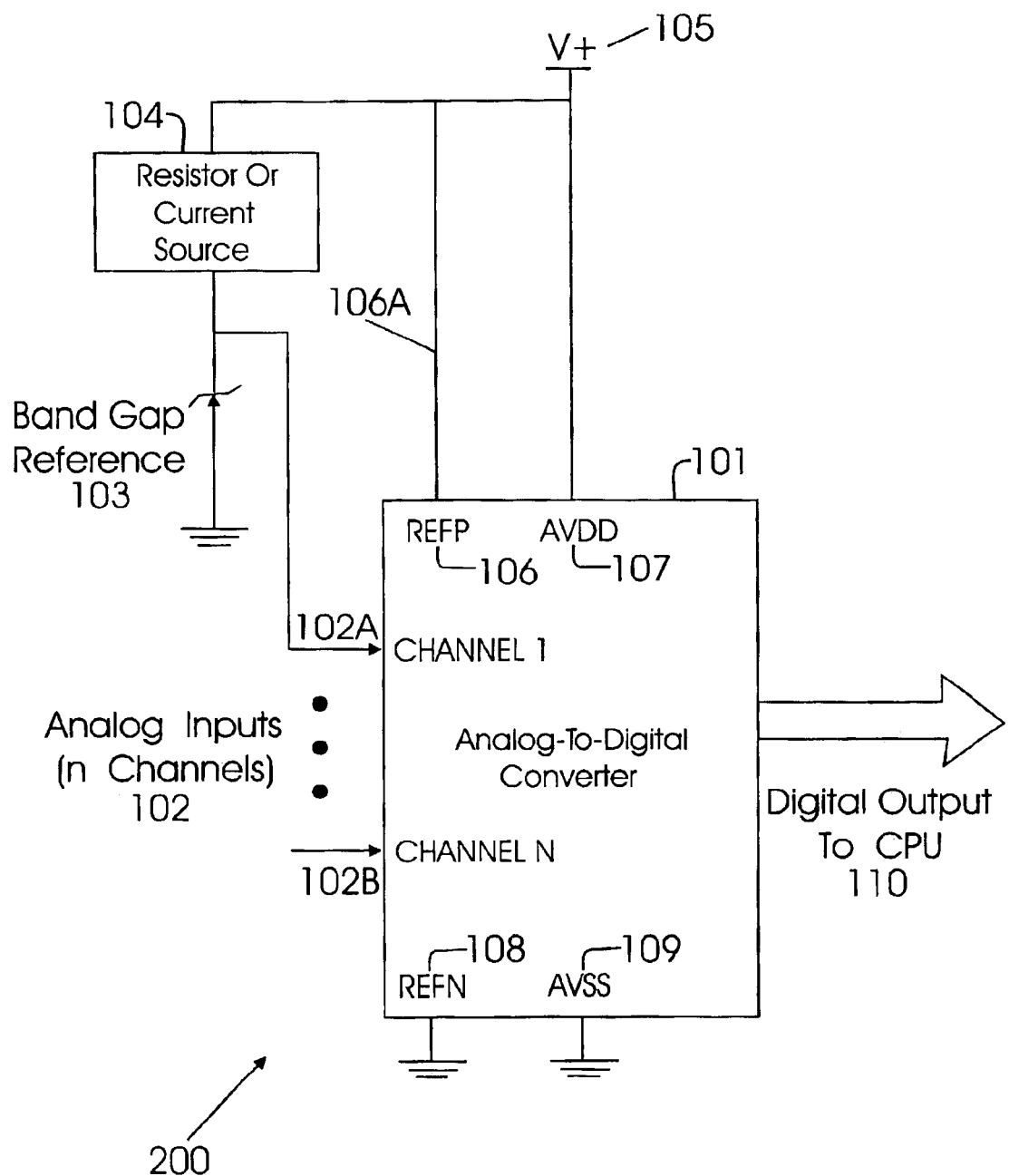
FIG. 3 shows a circuit for implementing an ADC with increased dynamic range, according to one aspect of the present invention.

FIG. 3 shows a system for increasing the dynamic range of ADC 101. In FIG. 3, the positive voltage supply 105 is operationally coupled to both AVDD 107 and REFP 106 and BGR 103 is connected to one of ADC 101's analog input channels (for illustration purposes shown as 102A).

Figure 1:
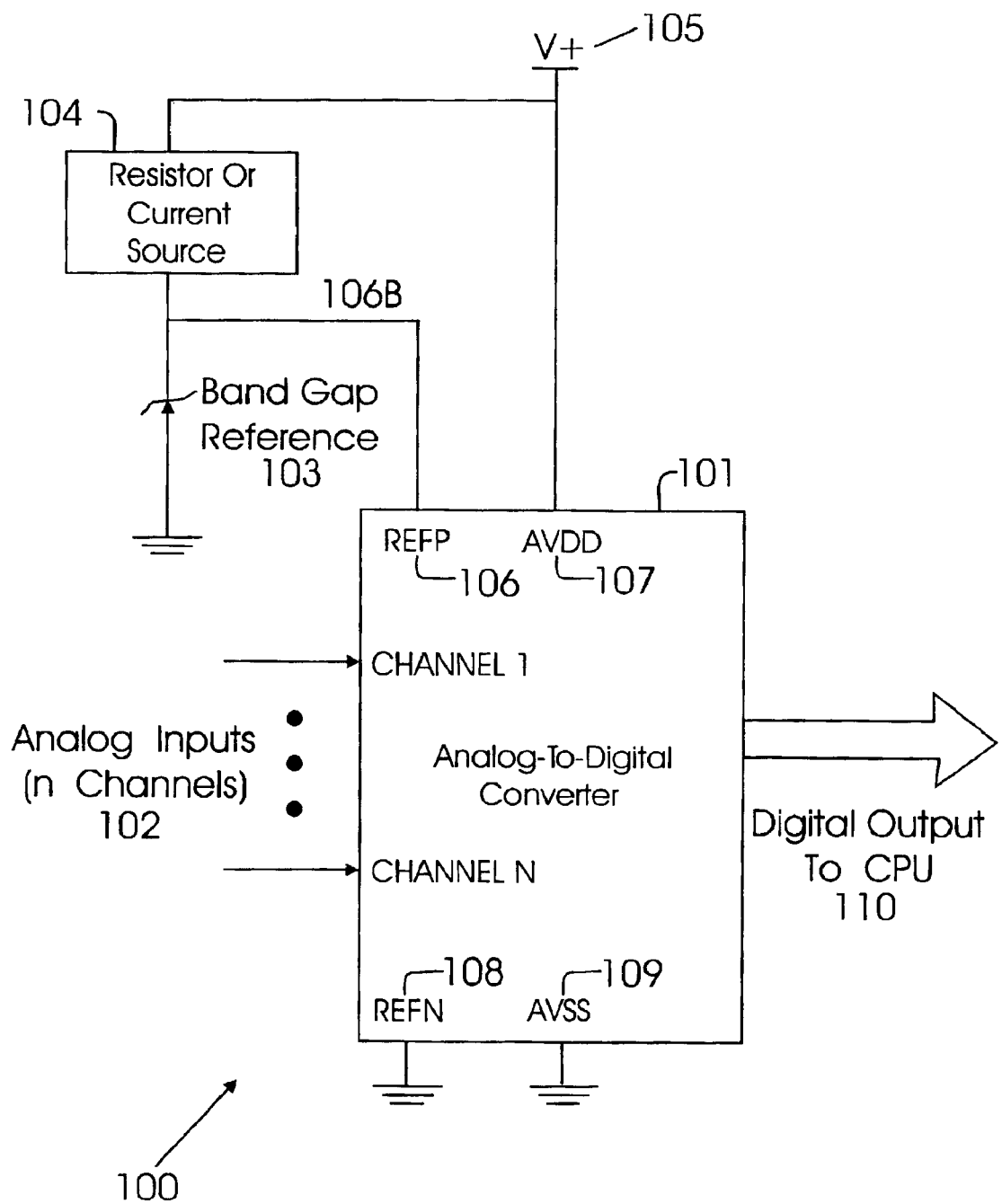
FIGS. 1 and 2 show examples of prior art circuits for traditional ADC implementation.
Figure 2:
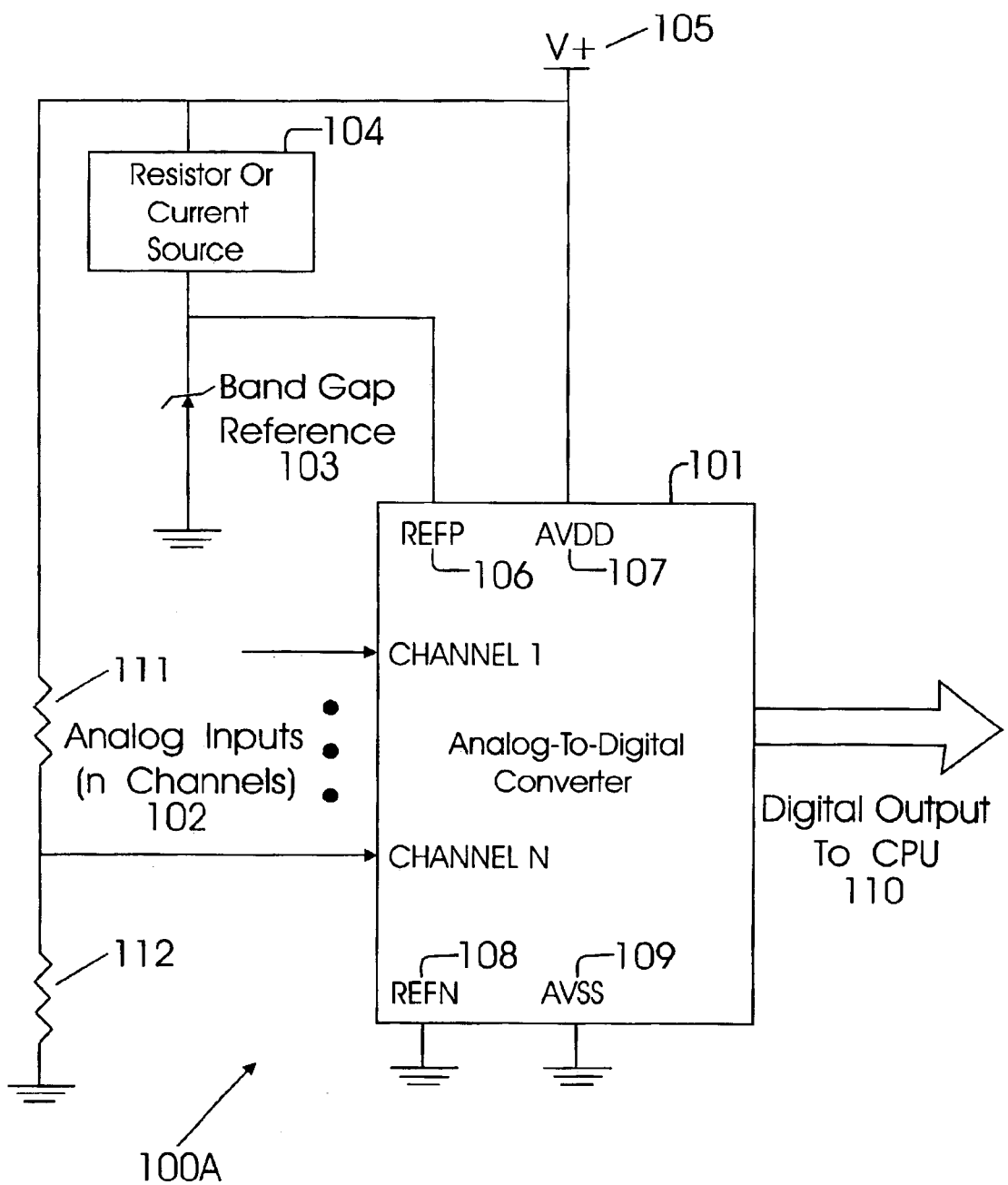

Although BGR circuit 103 is not required in this implementation for ADC 101 to function properly, BGR 103 accomplishes at least the following two purposes:

(a) It provides a tighter tolerance reference voltage than the supply voltage (typically +/−5%); and (b) It allows AVDD 107 voltage to be measured by ADC 101 without requiring a divider connection to an analog input channel (as shown in FIG. 2.)

BGR 103 voltage value is measured by a CPU 110 and used as a calibration constant for accurately determining the values of AVDD (REFP) and the bit weight.

The following shows how the actual AVDD value may be determined:

AVDD (Actual)/AVDD (nominal)=VBGR (nominal)/VBGR (measured)

AVDD (actual)=AVDD (nominal)*VBGR (nominal)/VBGR (measured)

where VBGR is the BGR voltage.
Also;

VBGRdo (nominal)/VBGRdo (measured)=VBGR (nominal)/VBGR (measured)

where VBGRdo is ADC 101 digital output value for the BGR 103 analog voltage 102A Bit Weight (actual)=AVDD (actual)/$2^n$ The following is an example showing the adaptive aspect of the present invention, by using a REFP (AVDD) value of 2.5 volts (nominal), a REFN value of 0 volts (ground; single supply implementation), and ADC 101 resolution of 10 bits. BGR 103 voltage is 1.2V. If the digital output value of ADC Channel 102C (BGR value) is 1CF hexadecimal (463 decimal), then the actual values (within BGR 103 tolerance) of AVDD and the ADC bit weight are determined as follows:

The nominal BGR digital output value is calculated as:

VBGR (nominal)/Bit Weight (nominal)=1.2V/2.44 mV=491.52 decimal (approximately 1EB hexadecimal)

Based on the digital output value of 1CF hexadecimal (463 decimal) for the BGR channel (102A), the actual values of AVDD 107 and ADC 101 bit weight would be:

AVDD(actual)=2.5V*491.52/463=2.654V

Bit Weight(actual)=2.654V/1024=2.59 mV

As can be seen, the measured BGR voltage is inversely proportional to the actual AVDD voltage i.e. as the actual AVDD voltage goes down, the measured BGR voltage goes up and vice-versa. The BGR voltage becomes a larger or smaller proportion of the positive reference voltage.

Figure 4:
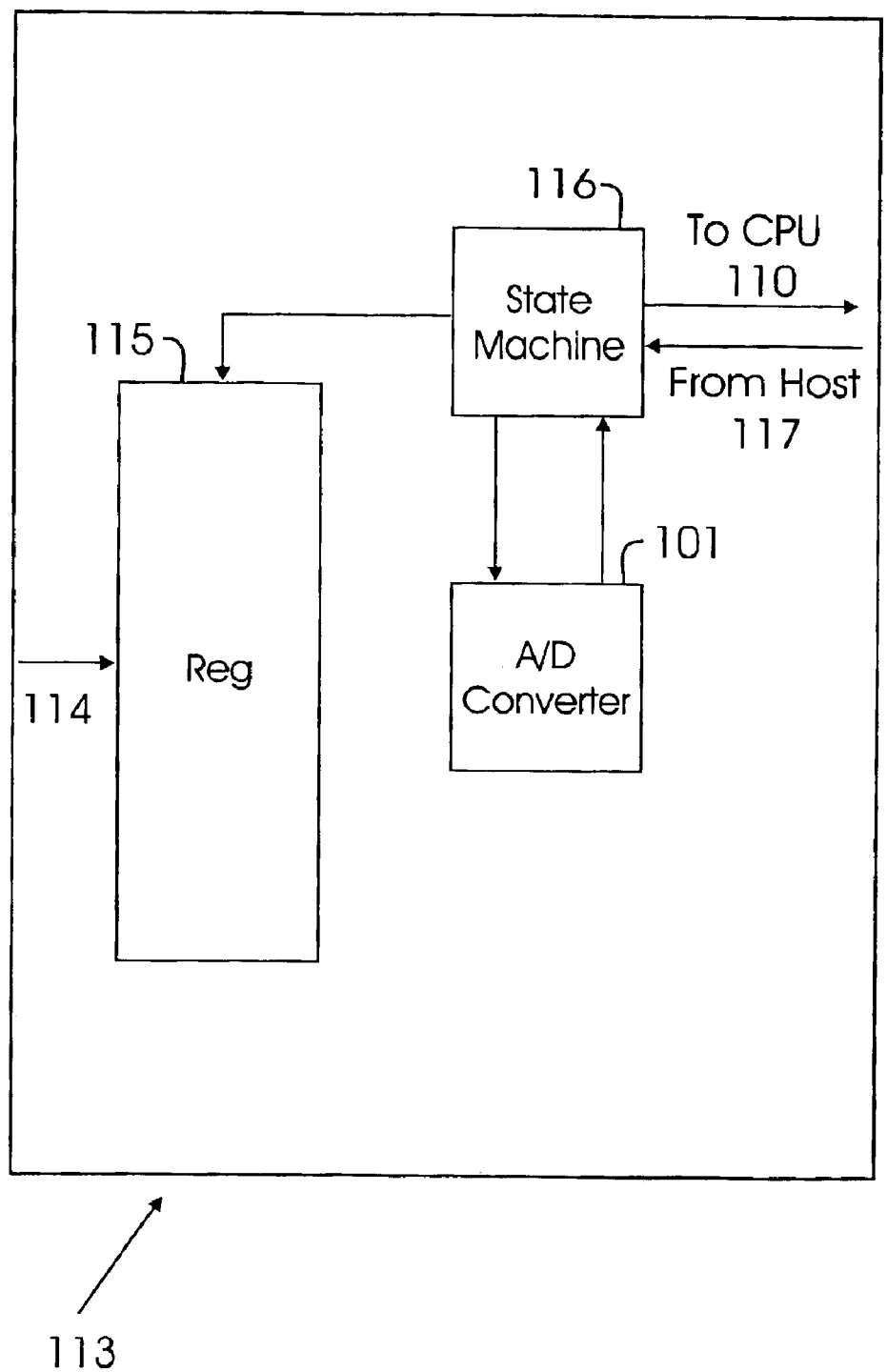
FIG. 4 is a block diagram of a system using an ADC, according to one aspect of the present invention.

FIG. 4 shows a block diagram of a system (or ASIC) 113 using ADC 101, according to one aspect of the present invention. It is noteworthy that this is only an example to illustrate the various adaptive aspects of the present invention. System 113 includes a State machine 116 that reads input 114 from a register 115. ADC 101 converts the analog input signal and the output is sent to CPU 110. The value of the voltage at ADC 101 input is determined by the process described above.

In one aspect of the present invention, the dynamic range available for analog voltage measurement is increased.

In another aspect of the present invention, a pin is saved in the chip using the foregoing aspect of the present invention because BGR 103 and current source 104 connection to ADC 101 analog input (102A) is internal to the ASIC.

The present invention also saves an ASIC pin that would be required for a dedicated REFP 106 connection by connecting REFP 106 to AVDD 107 internally.

Although the present invention has been described with reference to specific embodiments, these embodiments are illustrative only and not limiting. For example, the foregoing voltage calculations are merely to illustrate the adaptive aspects of the present invention. Many other applications and embodiments of the present invention will be apparent in light of this disclosure and the following claims.

What is claimed is:

1. An analog to digital converter ("ADC"), comprising:
a band gap reference (BGR) circuit whose output is a direct analog input to the ADC;
a positive analog supply voltage (AVDD);
a positive analog reference voltage (REFP); and
a voltage supply operationally coupled to both the positive analog supply voltage (AVDD) and the positive analog reference voltage (REFP);
wherein a measured BGR value is used by a CPU as a calibration constant for determining an AVDD value.

2. The ADC of claim 1, wherein the measured BGR value is used by the CPU as a calibration constant for determining a REFP value, and a Bit Weight value.

3. The ADC of claim 1, wherein the measured BGR value is inversely proportional to the actual AVDD value.

4. A system using a CPU, comprising:
an analog to digital converter ("ADC"), wherein the ADC includes:
a band gap reference (BGR) circuit whose output is a direct analog input to the ADC;
a positive analog supply voltage (AVDD);
a positive analog reference voltage (REFP); and
a voltage supply operationally coupled to both the positive supply voltage (AVDD) and the positive analog reference voltage (REFP);
wherein a measured BGR value is used by the CPU as a calibration constant for determining an AVDD value.

5. The system of claim 4, wherein the measured BGR value is used by the CPU as a calibration constant for determining a REFP value, and a Bit Weight value.

6. The system of claim 4, wherein the measured BGR value is inversely proportional to the actual AVDD value.

7. An application specific integrated circuit ("ASIC"), comprising:
an analog to digital converter ("ADC"), comprising:
a band gap reference (BGR) circuit whose output is a direct analog input to the ADC;
a positive analog supply voltage (AVDD);
a positive analog reference voltage (REFP); and
a voltage supply operationally coupled to both the positive analog supply voltage (AVDD) and the positive analog reference voltage (REFP);
wherein a measured BGR value is used by a CPU as a calibration constant for determining an AVDD value.

8. The ASIC of claim 7, wherein the measured BGR value is used by the CPU as a calibration constant for determining a REFP value, and a Bit Weight value.

9. The system of claim 7, wherein the measured BGR value is inversely proportional to the actual AVDD value.

* * * * *